US012622136B2

(12) United States Patent
Zeng

(10) Patent No.: US 12,622,136 B2
(45) Date of Patent: May 5, 2026

(54) DISPLAY PANELS WITH OXIDE TRANSISTOR CONNECTED TO SILICON TRANSISTOR

(71) Applicant: Wuhan China Star Optoelectronics Semiconductor Display Technology Co., Ltd., Wuhan (CN)

(72) Inventor: Mian Zeng, Wuhan (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 442 days.

(21) Appl. No.: 18/270,244

(22) PCT Filed: Jun. 14, 2023

(86) PCT No.: PCT/CN2023/100308
§ 371 (c)(1),
(2) Date: Jun. 29, 2023

(87) PCT Pub. No.: WO2024/198103
PCT Pub. Date: Oct. 3, 2024

(65) Prior Publication Data
US 2025/0133905 A1     Apr. 24, 2025

(30) Foreign Application Priority Data
Mar. 29, 2023    (CN) ......................... 202310344182.3

(51) Int. Cl.
H10K 59/121     (2023.01)
H10K 59/124     (2023.01)
H10K 59/131     (2023.01)

(52) U.S. Cl.
CPC ....... *H10K 59/1213* (2023.02); *H10K 59/124* (2023.02); *H10K 59/131* (2023.02)

(58) Field of Classification Search
CPC . H10K 59/1213; H10K 59/131; H10K 59/124
See application file for complete search history.

(56) References Cited

U.S. PATENT DOCUMENTS

| | | | |
|---|---|---|---|
| 10,950,178 B2 | 3/2021 | Wacyk | |
| 11,804,177 B2 | 10/2023 | Wang | |
| 2016/0240565 A1* | 8/2016 | Kim ..................... | H10D 86/481 |
| 2017/0221429 A1* | 8/2017 | Kobayashi ......... | H10D 30/6755 |
| 2018/0090616 A1* | 3/2018 | Nakagawa ....... | H03K 19/17708 |

(Continued)

FOREIGN PATENT DOCUMENTS

| | | |
|---|---|---|
| CN | 111754922 | 10/2020 |
| CN | 111819680 | 10/2020 |

(Continued)

OTHER PUBLICATIONS

International Search Report and the Written Opinion Dated Nov. 20, 2023 From the International Searching Authority Re. Application No. PCT/CN2023/100308 and Its Translation Into English. (15 Pages).

*Primary Examiner* — Lex H Malsawma

(57) ABSTRACT

A display panel includes a silicon substrate and an oxide transistor layer disposed on a side of the silicon substrate. The silicon substrate includes a single-crystal silicon transistor, and the oxide transistor layer includes an oxide transistor electrically connected to the single-crystal silicon transistor.

20 Claims, 6 Drawing Sheets

(56) References Cited

U.S. PATENT DOCUMENTS

| | | | | |
|---|---|---|---|---|
| 2018/0113566 A1* | 4/2018 | Shigemori | ........... | G02F 1/1368 |
| 2021/0090513 A1* | 3/2021 | Takahashi | ........... | G09G 3/3659 |
| 2022/0352279 A1* | 11/2022 | Kobayashi | .............. | G09G 3/20 |
| 2023/0093906 A1 | 3/2023 | Huang | | |

FOREIGN PATENT DOCUMENTS

| | | |
|---|---|---|
| CN | 212365460 | 1/2021 |
| CN | 113889520 | 1/2022 |

\* cited by examiner

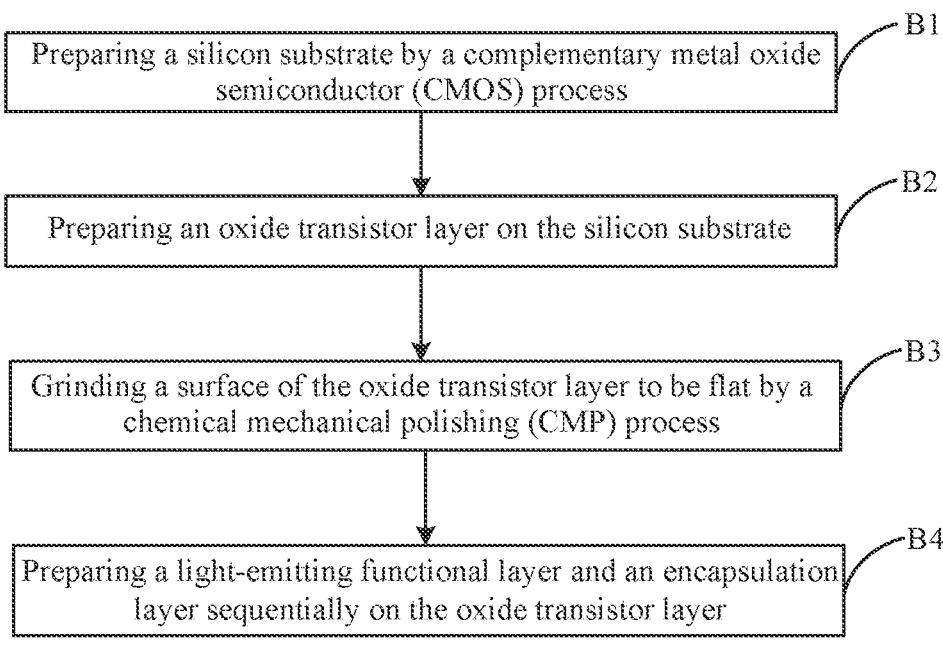

Preparing a silicon substrate by a complementary metal oxide semiconductor (CMOS) process — B1

Preparing an oxide transistor layer on the silicon substrate — B2

Grinding a surface of the oxide transistor layer to be flat by a chemical mechanical polishing (CMP) process — B3

Preparing a light-emitting functional layer and an encapsulation layer sequentially on the oxide transistor layer — B4

FIG. 8

DISPLAY PANELS WITH OXIDE TRANSISTOR CONNECTED TO SILICON TRANSISTOR

RELATED APPLICATIONS

This application
is a National Phase of PCT Patent Application No. PCT/CN2023/100308 having International filing date of Jun. 14, 2023, which claims the benefit of priority of China Patent Application No. 202310344182.3 filed on Mar. 29, 2023. The contents of the above applications are all incorporated by reference as if fully set forth herein in their entirety.

TECHNICAL FIELD

The present disclosure relates to display technologies, and in particular to display devices.

BACKGROUND

Silicon-based organic light-emitting diodes (OLEDs) micro display technology is at an intersection point of microelectronics technology and optoelectronics technology. Combining OLEDs technology and complementary metal oxide semiconductor (CMOS) technology, the silicon-based OLEDs micro display technology is intersection and integration of optoelectronics industry and microelectronics industry, promoting development of a new generation of micro displays.

Compared to existing glass-based OLEDs, silicon-based OLEDs can significantly increase pixel per inch (PPI) while reducing a physical size of a display panel due to a fact that a pixel circuit of the silicon-based OLEDs is directly placed on a silicon wafer and prepared by a wafer process, making the silicon-based OLEDs have broad application prospects in AR/VR displays.

An existing silicon-based OLED display panel with a pixel circuit and a peripheral driving circuit is generally prepared by directly evaporating OLED devices and an encapsulation layer on a wafer. However, due to a material of an active layer in the silicon-based OLED display panel is single-crystal silicon, resulting in a higher off-state current of the silicon-based OLED display panel. Under low-frequency driving, a driving current may change due to a high leakage current, ultimately causing a phenomenon of display flickering.

SUMMARY

The present disclosure provides a display panel to alleviate a technical problem of flickering of a display panel with high PPI.

To solve the above-mentioned problem, technical solutions provided by the present disclosure are as follows.

The present disclosure provides a display panel, which includes:

a silicon substrate including a single-crystal silicon transistor; and an oxide transistor layer disposed on a side of the silicon substrate and including an oxide transistor;

in which the oxide transistor is electrically connected to the single-crystal silicon transistor.

Optionally, in some embodiments of the present disclosure, the silicon substrate includes a first passivation layer and a first connection element, the first connection element is disposed in the first passivation layer and passes through the first passivation layer; the oxide transistor is electrically connected to the single-crystal silicon transistor through the first connection element.

Optionally, in some embodiments of the present disclosure, the oxide transistor layer includes a second passivation layer, a first lap-joint electrode, and a first signal line disposed close to a side of the silicon substrate, the first signal line and the first lap-joint electrode are disposed in a same layer and spaced apart, the first lap-joint electrode covers the first connection element, and the second passivation layer covers the first lap-joint electrode and the first signal line; and in which the first signal line is electrically connected to a source of the oxide transistor, and the first lap-joint electrode is electrically connected to a drain of the oxide transistor.

Optionally, in some embodiments of the present disclosure, the silicon substrate further includes a second connection element, the second connection element and the first connection element are disposed in a same layer and spaced apart, and the second connection element passes through the first passivation layer; the oxide transistor layer includes a second passivation layer, a first lap-joint electrode, and a second lap-joint electrode disposed close to a side of the silicon substrate, the second lap-joint electrode and the first lap-joint electrode are disposed in a same layer and spaced apart, the first lap-joint electrode covers the first connection element, the second lap-joint electrode covers the second connection element, and the second passivation layer covers the first lap-joint electrode and the second lap-joint electrode; and in which the first connection element is electrically connected to the single-crystal silicon transistor, and electrically connected to a drain of the oxide transistor through the first lap-joint electrode; and the second connection element is electrically connected to a second signal line in the silicon substrate, and electrically connected to a source of the oxide transistor through the second lap-joint electrode.

Optionally, in some embodiments of the present disclosure, the silicon substrate further includes a second connection element, the second connection element and the first connection element are disposed in a same layer and spaced apart, and the second connection element passes through the first passivation layer; the oxide transistor layer includes a second passivation layer, a first lap-joint electrode, and a second lap-joint electrode disposed close to a side of the silicon substrate, the second lap-joint electrode and the first lap-joint electrode are disposed in a same layer and spaced apart, the first lap-joint electrode covers the first connection element, the second lap-joint electrode covers the second connection element, and the second passivation layer covers the first lap-joint electrode and the second lap-joint electrode; and in which the silicon substrate includes two single-crystal silicon transistors, the first connection element is electrically connected to one of the two single-crystal silicon transistors, the first lap-joint electrode is electrically connected to a drain of the oxide transistor, the second connection element is electrically connected to another of the two single-crystal silicon transistors, and the second lap-joint electrode is electrically connected to a source of the oxide transistor.

Optionally, in some embodiments of the present disclosure, the display panel further includes a light-emitting functional layer disposed on a side of the oxide transistor layer away from the silicon substrate; the light-emitting functional layer includes an anode disposed close to the side of the oxide transistor layer, a cathode disposed away from the side of the oxide transistor layer, and an organic light-emitting layer disposed between the anode and the cathode; and the oxide transistor layer further includes a tungsten plug and a third passivation layer disposed on a side of the drain away from the silicon substrate, a surface of the tungsten plug away from the silicon substrate is flush with a surface of the third passivation layer away from the silicon substrate; the anode covers the tungsten plug, and the tungsten plug is electrically connected to the anode and the drain.

Optionally, in some embodiments of the present disclosure, the display panel further includes an encapsulation layer disposed on the light-emitting functional layer, and covering and packaging the light-emitting functional layer, the oxide transistor layer, and the silicon substrate; and the encapsulation layer includes a first inorganic layer, a second inorganic layer, and an organic layer disposed between the first inorganic layer and the second inorganic layer.

Optionally, in some embodiments of the present disclosure, the silicon substrate further includes a third connection element, the third connection element and the first connection element are disposed in a same layer and spaced apart, and pass through the first passivation layer; the oxide transistor layer includes a second passivation layer, a first lap-joint electrode, and a third lap-joint electrode disposed close to a side of the silicon substrate, the third lap-joint electrode and the first lap-joint electrode are disposed in a same layer and spaced apart, the first lap-joint electrode covers the first connection element, the third lap-joint electrode covers the third connection element, and the second passivation layer covers the first lap-joint electrode and the third lap-joint electrode; and in which the silicon substrate includes two single-crystal silicon transistors, the first signal line is electrically connected to a source of the oxide transistor, the first lap-joint electrode is electrically connected to a drain of the oxide transistor, and electrically connected to one of the two single-crystal silicon transistors through the first connection element, and the third lap-joint electrode is electrically connected to another of the two single-crystal silicon transistors through the third connection element.

Optionally, in some embodiments of the present disclosure, the silicon substrate further includes a second connection element and a third connection element, and the second connection element, the third connection element, and the first connection element are disposed in a same layer and spaced apart, and pass through the first passivation layer; the oxide transistor layer includes a second passivation layer, a first lap-joint electrode, a second lap-joint electrode, and a third lap-joint electrode disposed close to a side of the silicon substrate, the third lap-joint electrode, the second lap-joint electrode, and the first lap-joint electrode are disposed in a same layer and spaced apart, the first lap-joint electrode covers the first connection element, the second lap-joint electrode covers the second connection element, the third lap-joint electrode covers the third connection element, and the second passivation layer covers the first lap-joint electrode, the second lap-joint electrode, and the third lap-joint electrode; and in which the silicon substrate includes two single-crystal silicon transistors, the first connection element is electrically connected to one of the two single-crystal silicon transistors, and electrically connected to a drain of the oxide transistor through the first lap-joint electrode, the second connection element is electrically connected to a second signal line in the silicon substrate, and electrically connected to a source of the oxide transistor through the second lap-joint electrode, and the third lap-joint electrode is electrically connected to another of the two single-crystal silicon transistors through the third connection element.

Optionally, in some embodiments of the present disclosure, the display panel further includes a light-emitting functional layer disposed on a side of the oxide transistor layer away from the silicon substrate; the light-emitting functional layer includes an anode disposed close to the side of the oxide transistor layer, a cathode disposed away from the side of the oxide transistor layer, and an organic light-emitting layer disposed between the anode and the cathode; and the oxide transistor layer further includes a transition electrode disposed on a side of the third lap-joint electrode away from the silicon substrate, and a tungsten plug and a third passivation layer disposed on a side of the transition electrode away from the third lap-joint electrode; a surface of the tungsten plug away from the silicon substrate is flush with a surface of the third passivation layer away from the silicon substrate, and the third lap-joint electrode, the transition electrode, the tungsten plug, and the anode are electrically connected in sequence.

Optionally, in some embodiments of the present disclosure, the display panel further includes an encapsulation layer disposed on the light-emitting functional layer, and covering and packaging the light-emitting functional layer, the oxide transistor layer, and the silicon substrate; and the encapsulation layer includes a first inorganic layer, a second inorganic layer, and an organic layer disposed between the first inorganic layer and the second inorganic layer.

Optionally, in some embodiments of the present disclosure, a surface of the first connection element close to the oxide transistor layer is flush with a surface of the first passivation layer close to the oxide transistor layer.

Optionally, in some embodiments of the present disclosure, the display panel includes a driving circuit including the single-crystal silicon transistor and the oxide transistor; and the driving circuit is selected from one or more of a pixel driving circuit, a gate driving circuit, and a source driving circuit.

Optionally, in some embodiments of the present disclosure, a driving transistor of the pixel driving circuit is the single-crystal silicon transistor, and at least one of transistors in the pixel driving circuit, other than the driving transistor, is the oxide transistor.

Optionally, in some embodiments of the present disclosure, the oxide transistor includes one or more of a thin film transistor with a top gate structure or a thin film transistor with a bottom gate structure.

BENEFICIAL EFFECTS

Compared to the existing art, the present disclosure provides a display panel, which includes a silicon substrate including a single-crystal silicon transistor, and an oxide transistor layer disposed on a side of the silicon substrate and including an oxide transistor; and the oxide transistor is electrically connected to the single-crystal silicon transistor. The oxide transistor is disposed on a side of the silicon substrate, so as to match transistor devices with low leakage current needs in a driving circuit, which is conducive to achieve low-frequency driving of the display panel while avoiding a problem of display flickering caused by a higher leakage current of the transistor devices in the driving circuit. At the same time, a stacking arrangement of the silicon substrate and the oxide transistor layer can achieve higher PPI.

DESCRIPTION OF DRAWINGS

FIG. 8 is a flowchart of a manufacturing method of a display panel according to an embodiment of the present disclosure.

Figure 1:
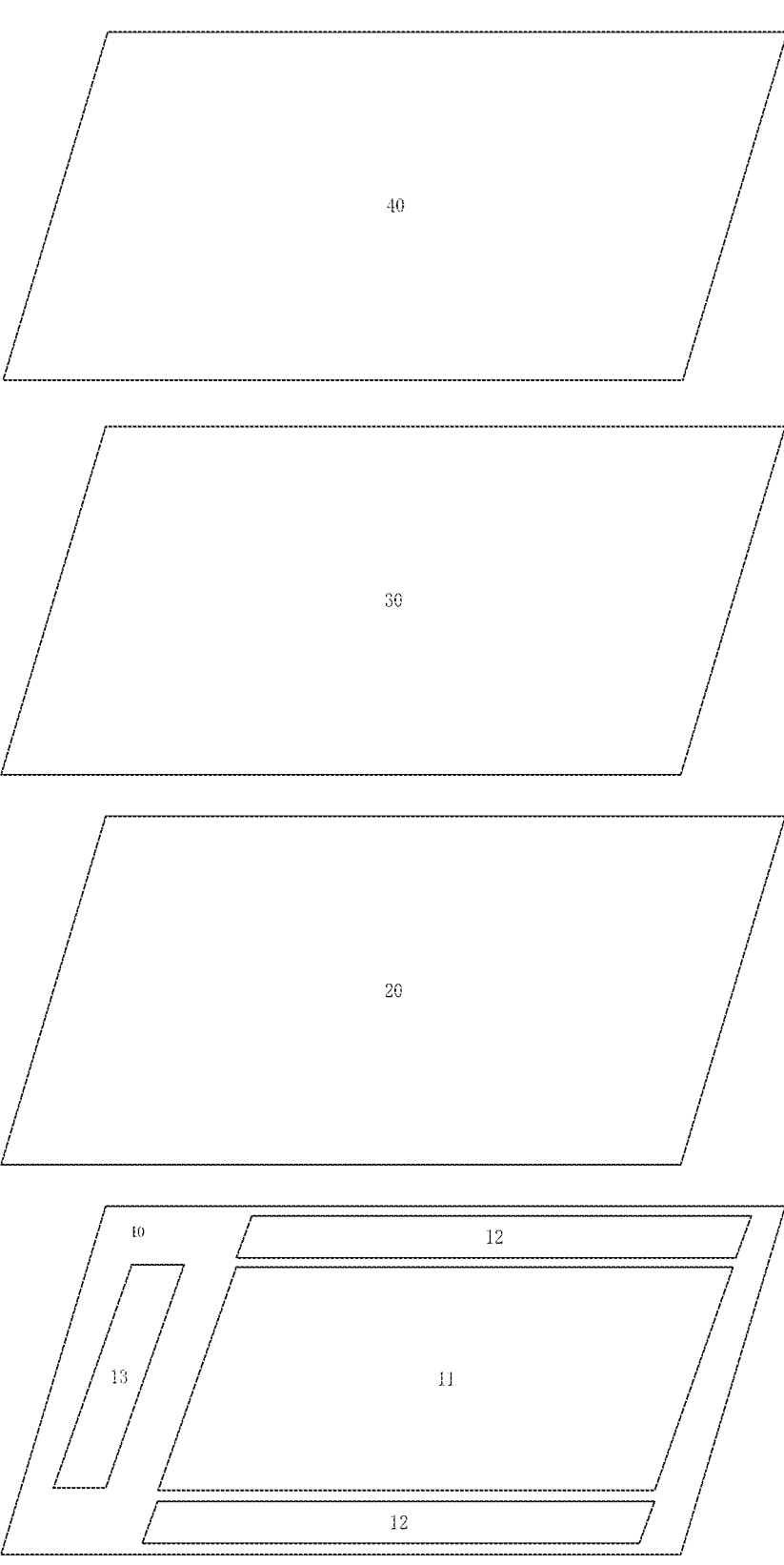
FIG. 1 is a schematic structural diagram of a stacked structure of a display panel according to embodiments of the present disclosure.

REFERENCE NUMERALS silicon substrate 10, pixel driving circuit 11, gate driving circuit 12, source driving circuit 13, single-crystal silicon active layer 111, first source drain layer 112, first insulation layer 113, first gate layer 114, connection layer 115, second insulation layer 116, third insulation layer 117, first tungsten plug 118, fourth insulation layer 119, first metal layer 120, fifth insulation layer 121, second metal layer 122, sixth insulation layer 123, third metal layer 124, first passivation layer 125, first connection element 126, second connection element 127, and third connection element 128;

oxide transistor layer 20, first lap-joint electrode 211, second lap-joint electrode 212, third lap-joint electrode 213, first signal line 214, second passivation layer 22, oxide active layer 23, seventh insulation layer 24, second gate layer 25, eighth insulation layer 26, second source drain layer 27, source 271, drain 272, transition electrode 273, third passivation layer 28, and third tungsten plug 29;

light-emitting functional layer 30, anode 31, pixel definition layer 32, organic light-emitting layer 33, cathode 34; and encapsulation layer 40, first inorganic layer 41, organic layer 42, and second inorganic layer 43.

DETAILED DESCRIPTION

In combination with drawings in embodiments of the present disclosure, purposes, technical solutions, and effects of the present disclosure will be described completely and clearly. It should be understood that specific embodiments described herein are only used to interpret the present disclosure and are not used to limit the present disclosure.

The present disclosure provides a display panel to alleviate a problem of display flickering of an existing silicon-based OLED under low-frequency driving.

Referring to FIG. 1 to FIG. 6, in some embodiments, a display panel of the present disclosure includes:

a silicon substrate 10 including a single-crystal silicon transistor;

an oxide transistor layer 20 disposed on a side of the silicon substrate 10 and including an oxide transistor;

in which the oxide transistor is electrically connected to the single-crystal silicon transistor.

In the embodiments of the present disclosure, the oxide transistor is disposed on a side of the silicon substrate, so as to match transistor devices with low leakage current needs in a driving circuit, which is conducive to achieve low-frequency driving of the display panel. At the same time, a stacking arrangement of the silicon substrate and the oxide transistor layer can achieve higher PPI.

Embodiment 1

Figure 2:
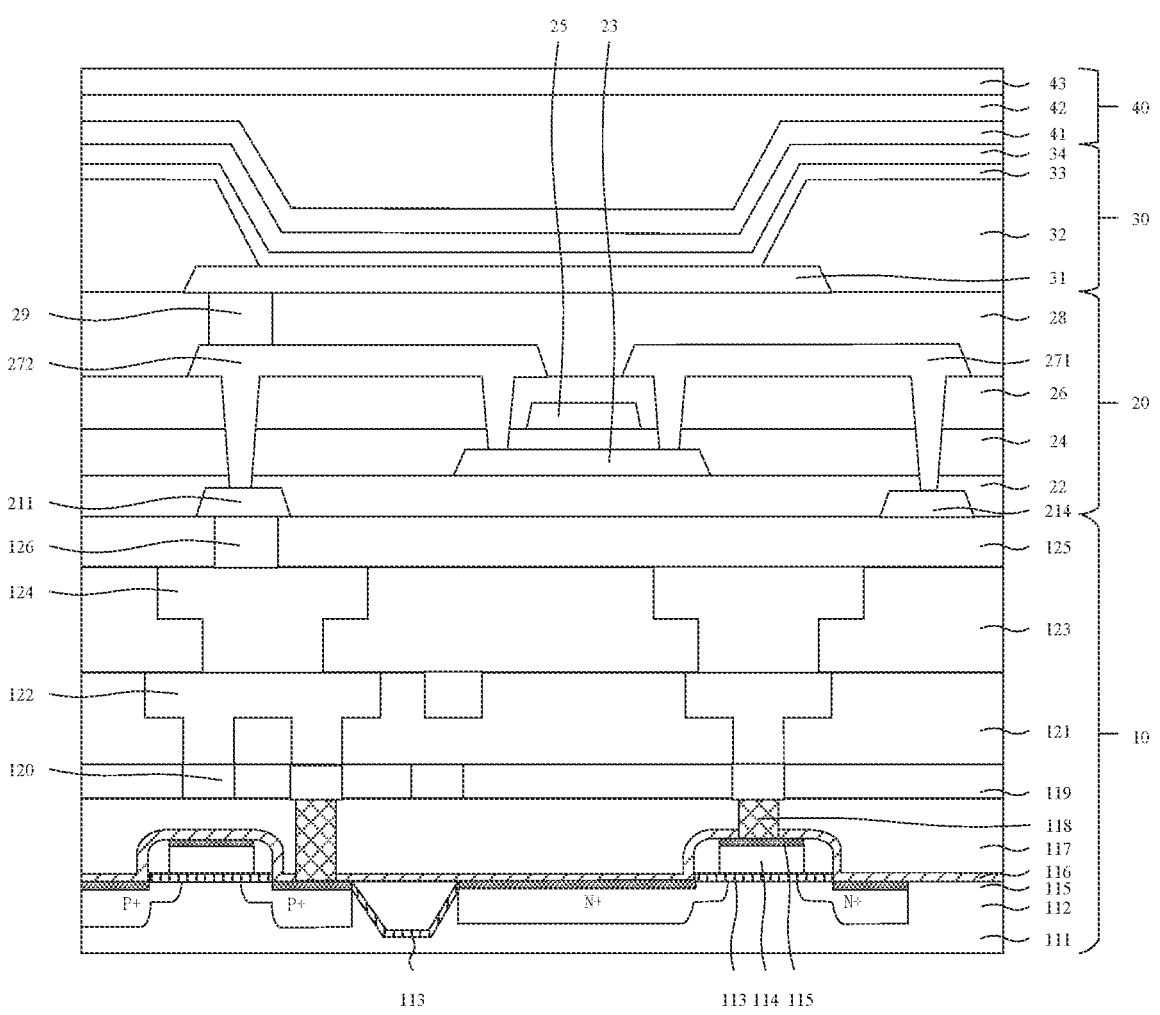
FIG. 2 is a first schematic structural diagram of a display panel according to an embodiment of the present disclosure.
Figure 7:
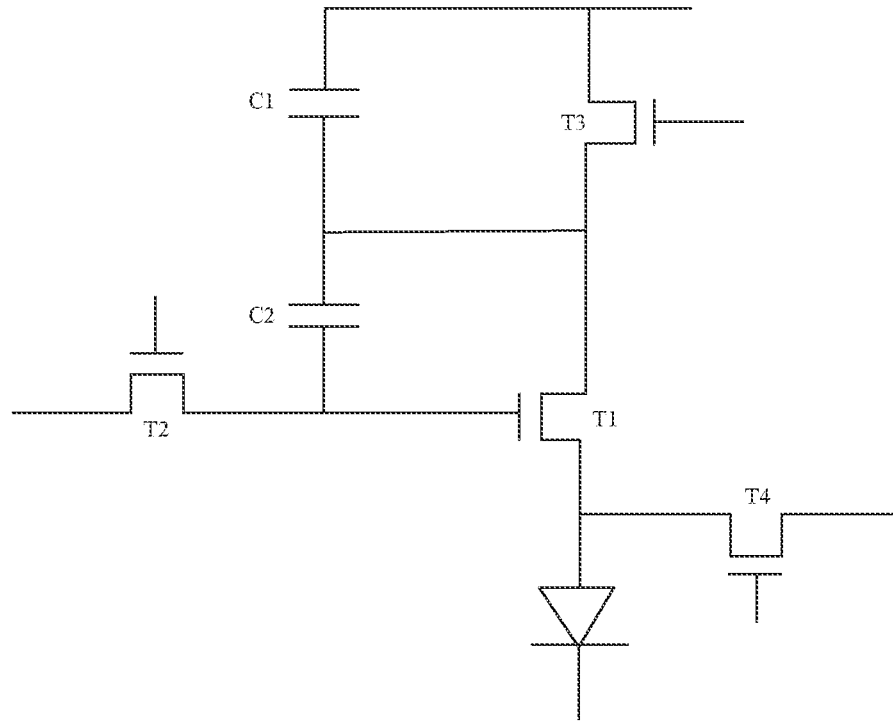
FIG. 7 is a schematic diagram of a pixel driving circuit of a display panel according to an embodiment of the present disclosure.

Referring to FIG. 1, FIG. 2, and FIG. 7, FIG. 1 specifically illustrates a schematic structural diagram of a stacked structure of a display panel according to an embodiment of the present disclosure, FIG. 2 specifically illustrates a first schematic structural diagram of the display panel according to the embodiment of the present disclosure, and FIG. 7 specifically illustrates a schematic structural diagram of a pixel driving circuit of the display panel according to the embodiment of the present disclosure.

The silicon substrate 10 includes a pixel driving circuit 11, a gate driving circuit 12, and a source driving circuit 13. Any of the driving circuits in a technical solution protected in the embodiment of the present disclosure may be any of the above-mentioned driving circuits. The pixel driving circuit may be any of a 2T1C pixel driving circuit, a 3T1C pixel driving circuit, a 4T1C pixel driving circuit, a 4T2C pixel driving circuit, a 5T1C pixel driving circuit, a 5T2C pixel driving circuit, a 6T1C pixel driving circuit, a 6T2C pixel driving circuit, a 7T1C pixel driving circuit, a 7T2C pixel driving circuit, a 8T1C pixel driving circuit, a 8T2C pixel driving circuit, or the like. In the embodiment of the present disclosure, taking the pixel driving circuit being the 4T2C pixel driving circuit for example, detailed illustration is provided for a display panel described in the embodiment of the present disclosure.

Referring to FIG. 7, the pixel driving circuit includes a transistor T1, a transistor T2, a transistor T3, a transistor T4, a capacitor C1, and a capacitor C2. The transistor T1 is a driving transistor. The transistor T3 is a driving control transistor. Both of the transistor T2 and the transistor T4 are reset transistors. The transistor T1 and the transistor T4 are electrically connected to an anode of a display device.

In the embodiment, the transistor T1 is the single-crystal silicon transistor, and the transistor T4 is the oxide transistor. The use of the single-crystal silicon transistor as the driving transistor can ensure needs for high mobility in the driving transistor. Moreover, a design of the oxide transistor can reduce impacts of leakage current on low-frequency driving.

In the embodiment of the present disclosure, the silicon substrate 10 includes a single-crystal silicon active layer 111, a first source drain layer 112, a first insulation layer 113, a first gate layer 114, a connection layer 115, a second insulation layer 116, a third insulation layer 117, a first tungsten plug 118, a fourth insulation layer 119, a first metal layer 120, a fifth insulation layer 121, a second metal layer 122, a sixth insulation layer 123, a third metal layer 124, a first passivation layer 125, and a second tungsten plug layer. The second tungsten plug layer includes a first connection element 126 disposed in the first passivation layer 125 and passing through the first passivation layer 125. The first connection element 126 is electrically connected to the single-crystal silicon transistor in the silicon substrate 10. Furthermore, a surface of the first connection element 126 close to the oxide transistor layer 20 is flush with a surface of the first passivation layer 125 close to the oxide transistor layer 20.

The oxide transistor layer 20 includes a lap-joint electrode layer, a second passivation layer 22, an oxide active layer 23, a seventh insulation layer 24, a second gate layer 25, an eighth insulation layer 26, a second source drain layer 27, a third passivation layer 28, and a third tungsten plug 29 sequentially stacked on the silicon substrate 10. The lap-joint electrode layer includes a first lap-joint electrode 211 and a first signal line 214. The first lap-joint electrode 211 covers the first connection element 126. The second source drain layer 27 includes a source 271 and a drain 272. The source 271 is electrically connected to an end of the oxide active layer 23 and the first signal line 214. The drain 272 is electrically connected to the other end of the oxide active layer 23 and the first lap-joint electrode 211. The third tungsten plug 29 is disposed on the drain 272 and passes through the third passivation layer 28.

Furthermore, a surface of the third tungsten plug 29 away from the silicon substrate 10 is flush with a surface of the third passivation layer 28 away from the silicon substrate. Because tungsten has excellent conductivity, by using tungsten plug as an electrical connection element between the oxide transistor and the silicon substrate 10 in the embodiment of the present disclosure, an electrical performance of the display panel can be improved. In the embodiment, the oxide transistor is a transistor with a top gate structure. In some embodiments, the oxide transistor may also be a transistor with a bottom gate structure.

The display panel also includes a light-emitting functional layer 30 disposed on a side of the oxide transistor layer 20 away from the silicon substrate 10. The light-emitting functional layer 30 includes an anode 31 disposed close to the side of the oxide transistor layer 20, a cathode 34 disposed away from the side of the oxide transistor layer, and an organic light-emitting layer 33 and a pixel definition layer 32 disposed between the anode 31 and the cathode 34. The anode 31 covers the third tungsten plug 29.

The display panel includes an encapsulation layer 40 disposed on the light-emitting functional layer 30. The encapsulation layer 40 includes a first inorganic layer 41, an organic layer 42, and a second inorganic layer 43.

In some embodiments, a material of the second tungsten plug layer and a material of the third tungsten plug 29 may also independently select from other materials. For example, the material of the second tungsten plug layer may be replaced with a same material as a material of the lap-joint electrode layer, and the material of the third tungsten plug 29 may be replaced with a same material as a material of the anode 31.

In the embodiment of the present disclosure, both of the lap-joint electrode layer and the second source drain layer 27 are stacked layers including a titanium layer, an aluminum layer, and a titanium layer. The anode 31 is a stacked layer including a titanium layer, an aluminum layer, a titanium nitride layer, and an indium tin oxide layer, or a stacked layer including an indium tin oxide layer, a silver layer, and an indium tin oxide layer.

The display panel described in the embodiment includes but is not limited to an organic light-emitting diode (OLED) display panel, a mini or micro light-emitting diode (MLED) display panel.

Embodiment 2

Figure 3:
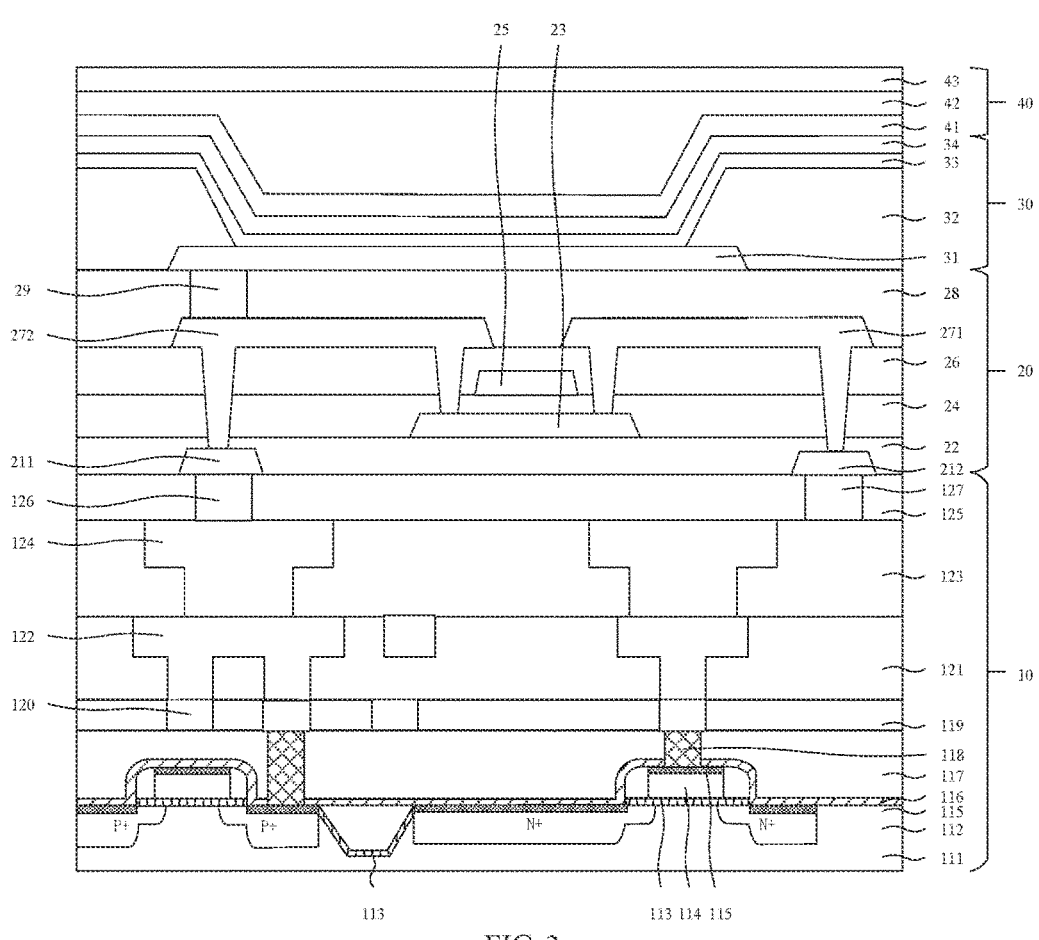
FIG. 3 is a second schematic structural diagram of a display panel according to an embodiment of the present disclosure.

Referring to FIG. 3 and FIG. 7, FIG. 3 specifically illustrates a second schematic structural diagram of a display panel according to an embodiment of the present disclosure. The same or the similar elements between this embodiment and the embodiment 1 are not repeated here, and details can refer to the embodiment 1. Ths embodiment differs from the embodiment 1 in that the second tungsten plug layer also includes a second connection element 127, and the lap-joint electrode layer includes a first lap-joint electrode 211 and a second lap-joint electrode 212; the first lap-joint electrode 211 covers the first connection element 126; the second lap-joint electrode 212 is electrically connected to the source 271 of the oxide transistor, and covers the second connection element 127; and the second connection element 127 is electrically connected to a second signal line in the silicon substrate 10.

Embodiment 3

Figure 4:
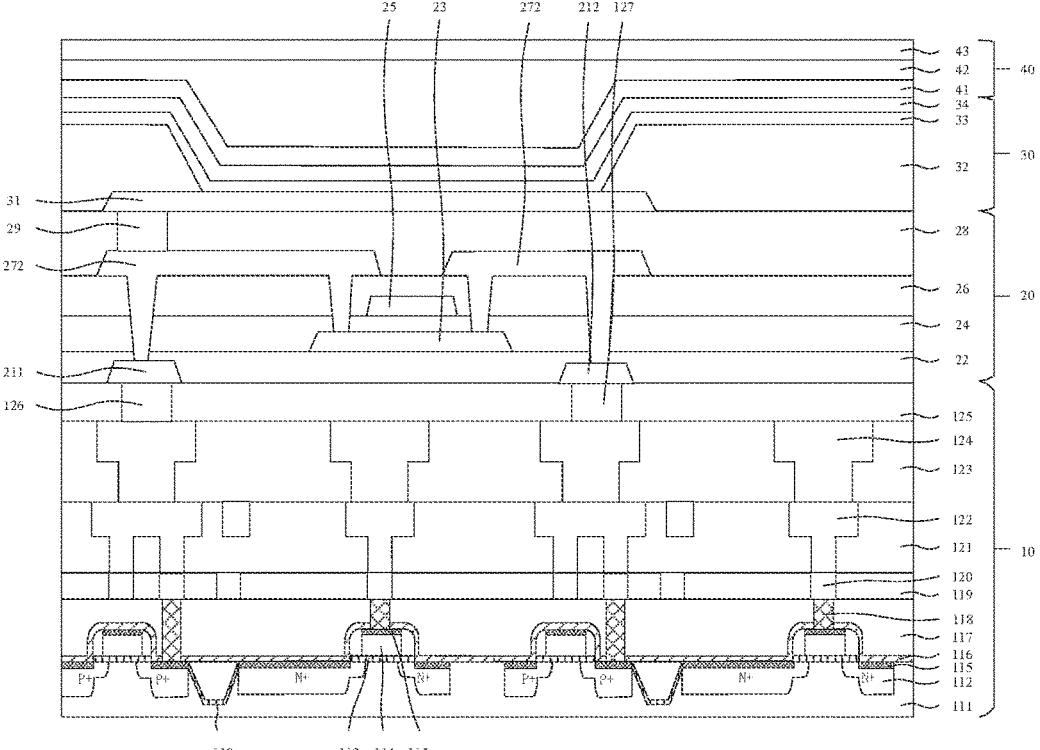
FIG. 4 is a third schematic structural diagram of a display panel according to an embodiment of the present disclosure.

Referring to FIG. 4 and FIG. 7 for the embodiment, the same or the similar elements between this embodiment and the embodiment 2 are not repeated here, and details can refer to the embodiment 2. This embodiment differs from the embodiment 2 in that the transistor T1 is the oxide transistor, and the transistor T4 is the single-crystal silicon transistor; the first connection element 126 is electrically connected to one of the single-crystal silicon transistors in the silicon substrate 10, and the second connection element 127 is electrically connected to another of single-crystal silicon transistors in the silicon substrate 10.

The display panel described in this embodiment is suitable for applications with low driving current needs. The driving circuit in the display panel includes but is not limited to an OLED pixel driving circuit and a MLED driving circuit, including but is not limited to a low-frequency driving circuit. When the display panel described in this embodiment is driven under a low current, due to the low driving current required by the display panel and the driving transistor operating in the saturation region, the transistor T1, which serves as the driving transistor, is configured to be the oxide transistor with a lower mobility. In this way, the display panel can not only meet driving needs of a tiny current to reduce impacts of a leakage current on low-frequency driving, but also helps to improve PPI of the display panel.

Embodiment 4

Figure 5:
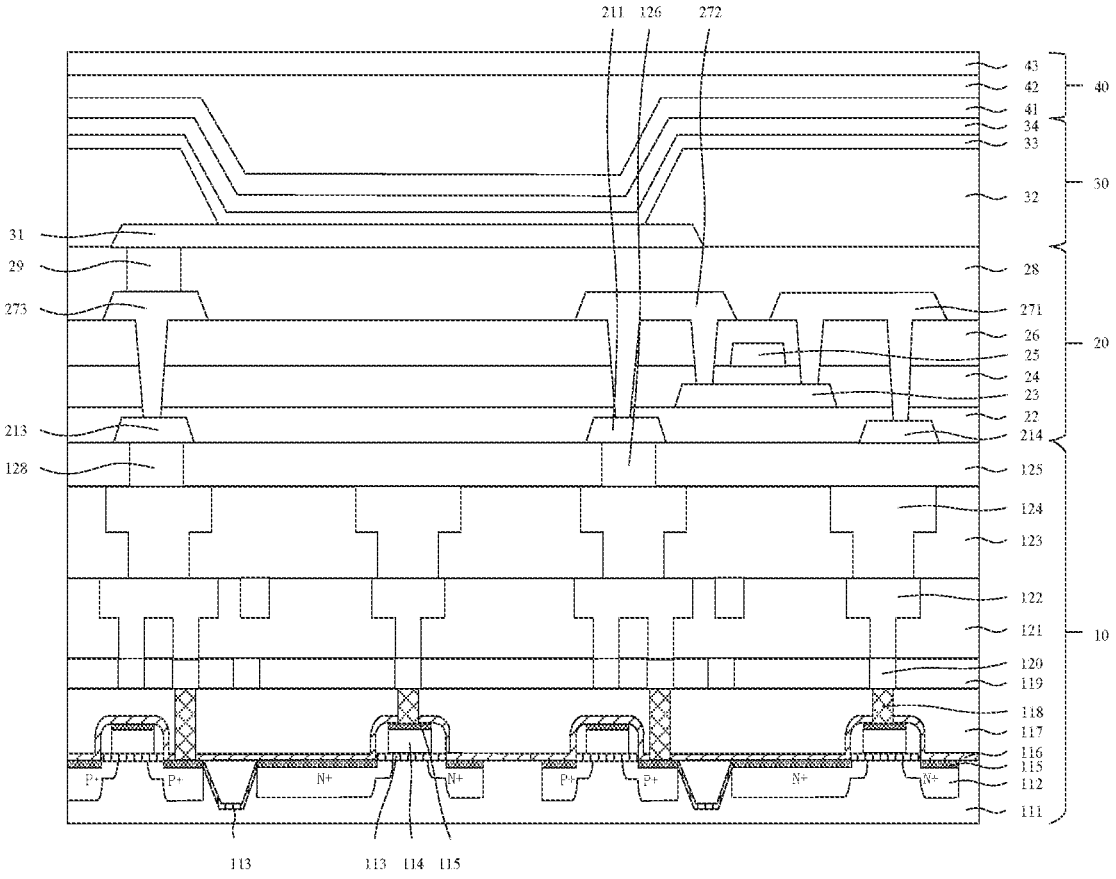
FIG. 5 is a fourth schematic structural diagram of a display panel according to an embodiment of the present disclosure.

Referring to FIG. 5 and FIG. 7, the same or the similar elements between this embodiment and the embodiment 1 are not repeated here, and details can refer to the embodiment 1. This embodiment differs from the embodiment 1 in that the silicon substrate 10 includes two single-crystal silicon transistors, one of the two single-crystal silicon transistors is the transistor T1, the transistor T2 and/or the transistor T3 are oxide transistors; the second tungsten plug layer also includes a third connection element 128, the lap-joint electrode layer also includes a third lap-joint electrode 213, and the second source drain layer also includes a transition electrode 273; the drain 272 of the oxide transistor is not connected to the anode 31; the anode 31, the third tungsten plug 29, the transition electrode 273, the third lap-joint electrode 213, and the third connection element 128 are electrically and sequentially connected; and the third connection element 128 is electrically connected to another of the two single-crystal silicon transistors in the silicon substrate 10.

Embodiment 5

Figure 6:
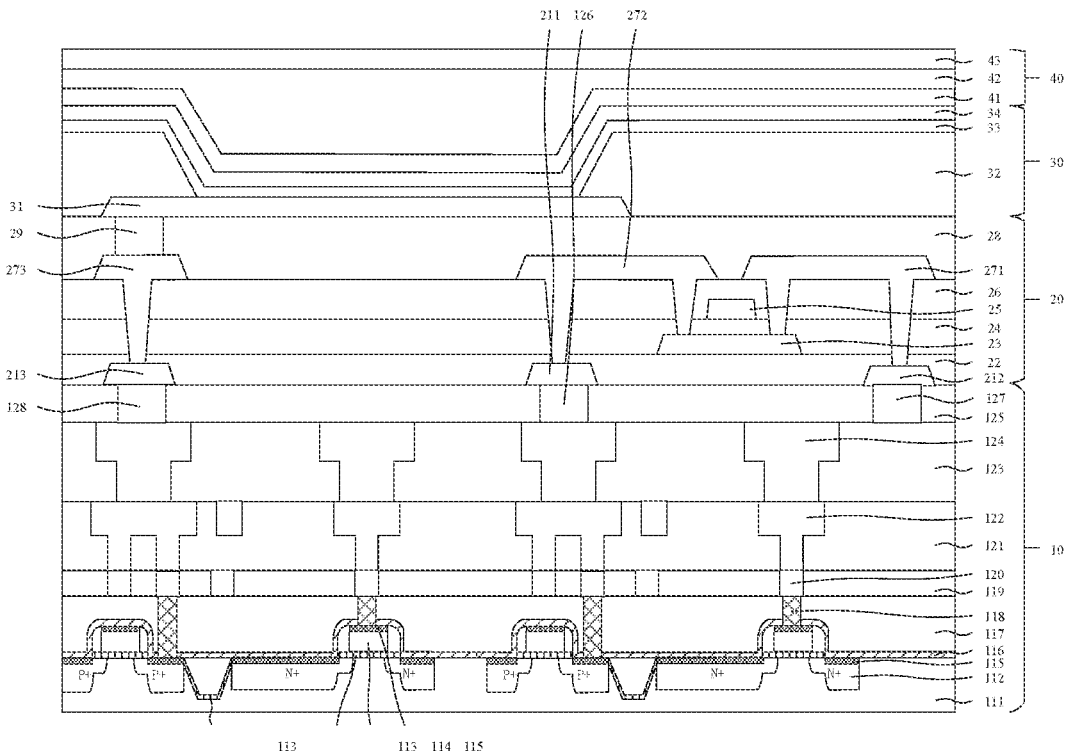
FIG. 6 is a fifth schematic structural diagram of a display panel according to an embodiment of the present disclosure.

Referring to FIG. 6 and FIG. 7, the same or the similar elements between this embodiment and the embodiment 4 are not repeated here, and details can refer to the embodiment 4. This embodiment differs from the embodiment 4 in that the second tungsten plug layer also includes a second connection element 127, and the lap-joint electrode layer includes the first lap-joint electrode 211, a second lap-joint electrode 212, and the third lap-joint electrode 213; the source 271 is electrically connected to the second lap-joint electrode 212; the second lap-joint electrode 212 covers the second connection element 127; and the second connection element 127 is electrically connected to a second signal line in the silicon substrate 10.

Referring to FIG. 8, the present disclosure also provides a manufacturing method of the display panel as described in any of the above-mentioned embodiments, which includes step B1, step B2, step B3, and step B4.

At step B1, the silicon substrate is prepared by a complementary metal oxide semiconductor (CMOS) process. Specifically, a part of the pixel driving circuit and the peripheral driving circuit are prepared.

At step B2, the oxide transistor layer is prepared on the silicon substrate. Specifically, a remaining part of the pixel driving circuit is prepared. The single-crystal silicon transistor in the silicon substrate is electrically connected to the oxide transistor in the oxide transistor layer through the second tungsten plug layer on the silicon substrate.

At step B3, a surface of the oxide transistor layer is ground to be flat by a chemical mechanical polishing (CMP) process. The flattened oxide transistor layer can provide a flat surface for an anode subsequently prepared, and the third tungsten plug exposes to be connected to the anode. In this way, compared to an existing display panel, a problem of poor lap-joint effect between the anode and the oxide transistor caused by impurity particles falling into via holes of the display panel can be avoided.

At step B4, the light-emitting functional layer and the encapsulation layer are sequentially prepared on the oxide transistor layer.

In view of the foregoing, the embodiments of the present disclosure provide the display panel and the manufacturing method thereof. The display panel includes the silicon substrate including the single-crystal silicon transistor, and the oxide transistor layer disposed on a side of the silicon substrate and including the oxide transistor; and the oxide transistor is electrically connected to the single-crystal silicon transistor. The oxide transistor is disposed on a side of the silicon substrate, so as to match transistor devices with low leakage current needs in a driving circuit, which is conducive to achieve low-frequency driving of the display panel while avoiding a problem of display flickering caused by a higher leakage current of the transistor devices in the driving circuit. At the same time, a stacking arrangement of the silicon substrate and the oxide transistor layer can achieve higher PPI.

In this paper, specific embodiments are adopted to illustrate a principle and implementation modes of the present disclosure. The description of the above-mentioned embodiments is only used to help understand methods and a core idea of the present disclosure. At the same time, for those skilled in the art, according to the idea of the present disclosure, there will be changes in specific implementation modes and a scope of the present disclosure. In conclusion, contents of the specification should not be interpreted as a limitation of the present disclosure.

What is claimed is:

1. A display panel, comprising:
a silicon substrate comprising a single-crystal silicon transistor; and
an oxide transistor layer disposed on a side of the silicon substrate and comprising an oxide transistor;
wherein the silicon substrate comprises a first passivation layer and a first tungsten plug, the first tungsten plug is disposed within the first passivation layer and passes through the first passivation layer, and a drain of the oxide transistor is electrically connected to the single-crystal silicon transistor through the first tungsten plug.

2. The display panel of claim 1, wherein the oxide transistor layer comprises a second passivation layer, a first lap-joint electrode, and a first signal line disposed close to a side of the silicon substrate, the first signal line and the first lap-joint electrode are disposed in a same layer and spaced apart, the first lap-joint electrode covers the first tungsten plug, and the second passivation layer covers the first lap-joint electrode and the first signal line; and
wherein the first signal line is electrically connected to a source of the oxide transistor, and the first lap-joint electrode is electrically connected between the drain of the oxide transistor and the first tungsten plug.

3. The display panel of claim 2, wherein the display panel further comprises a light-emitting functional layer disposed on a side of the oxide transistor layer away from the silicon substrate; wherein the light-emitting functional layer comprises an anode disposed close to the side of the oxide transistor layer, a cathode disposed away from the side of the oxide transistor layer, and an organic light-emitting layer disposed between the anode and the cathode; and wherein the oxide transistor layer further comprises a second tungsten plug and a third passivation layer disposed on a side of the drain away from the silicon substrate, a surface of the second tungsten plug away from the silicon substrate is flush with a surface of the third passivation layer away from the silicon substrate; the anode covers the second tungsten plug, and the second tungsten plug is electrically connected to the anode and the drain.

4. The display panel of claim 3, wherein the display panel further comprises an encapsulation layer disposed on the light-emitting functional layer, and covering and packaging the light-emitting functional layer, the oxide transistor layer, and the silicon substrate; and wherein the encapsulation layer comprises a first inorganic layer, a second inorganic layer, and an organic layer disposed between the first inorganic layer and the second inorganic layer.

5. The display panel of claim 1, wherein the silicon substrate further comprises a first connection element, the first connection element and the first tungsten plug are disposed in a same layer and spaced apart, and the first connection element passes through the first passivation layer; wherein the oxide transistor layer comprises a second passivation layer, a first lap-joint electrode, and a second lap-joint electrode disposed close to a side of the silicon substrate, the second lap-joint electrode and the first lap-joint electrode are disposed in a same layer and spaced apart, the first lap-joint electrode covers the first tungsten plug, the second lap-joint electrode covers the first connection element, and the second passivation layer covers the first lap-joint electrode and the second lap-joint electrode; and wherein the first connection element is electrically connected to a second signal line in the silicon substrate, and electrically connected to a source of the oxide transistor through the second lap-joint electrode.

6. The display panel of claim 1, wherein the silicon substrate further comprises a first connection element, the first connection element and the first tungsten plug are disposed in a same layer and spaced apart, and the first connection element passes through the first passivation layer; wherein the oxide transistor layer comprises a second passivation layer, a first lap-joint electrode, and a second lap-joint electrode disposed close to a side of the silicon substrate, the second lap-joint electrode and the first lap-joint electrode are disposed in a same layer and spaced apart, the first lap-joint electrode covers the first tungsten plug, the second lap-joint electrode covers the first connection element, and the second passivation layer covers the first lap-joint electrode and the second lap-joint electrode; and wherein the silicon substrate comprises two single-crystal silicon transistors, the first tungsten plug is electrically connected to one of the two single-crystal silicon transistors, the first lap-joint electrode is electrically connected between the drain of the oxide transistor and the first tungsten plug, the first connection element is electrically connected to another of the two single-crystal silicon transistors, and the second lap-joint electrode is electrically connected between a source of the oxide transistor and the first connection element.

7. The display panel of claim 1, wherein the silicon substrate further comprises a second connection element, the second connection element and the first tungsten plug are disposed in a same layer and spaced apart, and pass through the first passivation layer; wherein the oxide transistor layer comprises a second passivation layer, a first lap-joint electrode, and a third lap-joint electrode disposed close to a side of the silicon substrate, the third lap-joint electrode and the first lap-joint electrode are disposed in a same layer and spaced apart, the first lap-joint electrode covers the first tungsten plug, the third lap-joint electrode covers the second connection element, and the second passivation layer covers the first lap-joint electrode and the third lap-joint electrode; and wherein the silicon substrate comprises two single-crystal silicon transistors, the first signal line is electrically connected to a source of the oxide transistor, the first lap-joint electrode is electrically connected to a drain of the oxide transistor, and electrically connected to one of the two single-crystal silicon transistors through the first tungsten plug, and the third lap-joint electrode is electrically connected to another of the two single-crystal silicon transistors through the second connection element.

8. The display panel of claim 7, wherein the display panel further comprises a light-emitting functional layer disposed on a side of the oxide transistor layer away from the silicon substrate; wherein the light-emitting functional layer comprises an anode disposed close to the side of the oxide transistor layer, a cathode disposed away from the side of the oxide transistor layer, and an organic light-emitting layer disposed between the anode and the cathode; and wherein the oxide transistor layer further comprises a transition electrode disposed on a side of the third lap-joint electrode away from the silicon substrate, and a second tungsten plug and a third passivation layer disposed on a side of the transition electrode away from the third lap-joint electrode; a surface of the second tungsten plug away from the silicon substrate is flush with a surface of the third passivation layer away from the silicon substrate, and the third lap-joint electrode, the transition electrode, the second tungsten plug, and the anode are electrically connected in sequence.

9. The display panel of claim 8, wherein the display panel further comprises an encapsulation layer disposed on the light-emitting functional layer, and covering and packaging the light-emitting functional layer, the oxide transistor layer, and the silicon substrate; and wherein the encapsulation layer comprises a first inorganic layer, a second inorganic layer, and an organic layer disposed between the first inorganic layer and the second inorganic layer.

10. The display panel of claim 1, wherein the silicon substrate further comprises a first connection element and a second connection element, and the first connection element, the second connection element, and the first tungsten plug are disposed in a same layer and spaced apart, and pass through the first passivation layer; wherein the oxide transistor layer comprises a second passivation layer, a first lap-joint electrode, a second lap-joint electrode, and a third lap-joint electrode disposed close to a side of the silicon substrate, the third lap-joint electrode, the second lap-joint electrode, and the first lap-joint electrode are disposed in a same layer and spaced apart, the first lap-joint electrode covers the first tungsten plug, the second lap-joint electrode covers the first connection element, the third lap-joint electrode covers the second connection element, and the second passivation layer covers the first lap-joint electrode, the second lap-joint electrode, and the third lap-joint electrode; and wherein the silicon substrate comprises two single-crystal silicon transistors, the first tungsten plug is electrically connected to one of the two single-crystal silicon transistors, and electrically connected to the drain of the oxide transistor through the first lap-joint electrode, the first connection element is electrically connected to a second signal line in the silicon substrate, and electrically connected to a source of the oxide transistor through the second lap-joint electrode, and the third lap-joint electrode is electrically connected to another of the two single-crystal silicon transistors through the second connection element.

11. The display panel of claim 1, wherein a surface of the first tungsten plug close to the oxide transistor layer is flush with a surface of the first passivation layer close to the oxide transistor layer.

12. The display panel of claim 1, wherein the display panel comprises a driving circuit comprising the single-crystal silicon transistor and the oxide transistor; and wherein the driving circuit is selected from one or more of a pixel driving circuit, a gate driving circuit, and a source driving circuit.

13. The display panel of claim 12, wherein a driving transistor of the pixel driving circuit is the single-crystal silicon transistor, and at least one of transistors in the pixel driving circuit, other than the driving transistor, is the oxide transistor.

14. The display panel of claim 12, wherein a driving transistor of the pixel driving circuit is the oxide transistor, and at least one of transistors in the pixel driving circuit, other than the driving transistor, is the single-crystal silicon transistor.

15. The display panel of claim 1, wherein the oxide transistor comprises one or more of a thin film transistor with a top gate structure or a thin film transistor with a bottom gate structure.

16. The display panel of claim 1, wherein the single-crystal silicon transistor is a driving transistor, and the oxide transistor is a reset transistor.

17. The display panel of claim 1, further comprising a pixel driving circuit, wherein the pixel driving circuit is constituted by the single-crystal silicon transistor, the oxide transistor, a driving control transistor, a reset transistor, a first capacitor, and a second capacitor, and both the single-crystal silicon transistor and the oxide transistor are electrically connected to an anode of a light-emitting device in the display panel.

18. The display panel of claim 1, wherein the silicon substrate comprises a single-crystal silicon active layer, a first source drain layer, a first insulation layer, a first gate layer, a connection layer, a second insulation layer, a third insulation layer, a first tungsten plug, a fourth insulation layer, a first metal layer, a fifth insulation layer, a second metal layer, a sixth insulation layer, a third metal layer, a first passivation layer, and the first tungsten plug layer sequentially stacked.

19. The display panel of claim 1, wherein the oxide transistor layer comprises a lap-joint electrode layer, a second passivation layer, an oxide active layer, a seventh insulation layer, a second gate layer, an eighth insulation layer, a second source drain layer, a third passivation layer, and a second tungsten plug sequentially stacked on the silicon substrate; and wherein the lap-joint electrode layer comprises a first lap-joint electrode and a first signal line, and the first lap-joint electrode covers the first tungsten plug; the second source drain layer comprises a source and the drain, the source is electrically connected to both an end of the oxide active layer and the first signal line, and the drain is electrically connected to both another end of the oxide active layer and the first lap-joint electrode; the second tungsten plug is disposed on the drain and passes through the third passivation layer, and the second tungsten plug is electrically connected between the drain and an anode of a light-emitting device in the display panel.

20. The display panel of claim 1, wherein the silicon substrate comprises a single-crystal silicon active layer, a first source drain layer, a first insulation layer, a first gate layer, a connection layer, a second insulation layer, a third insulation layer, a first tungsten plug, a fourth insulation layer, a first metal layer, a fifth insulation layer, a second metal layer, a sixth insulation layer, a third metal layer, a first passivation layer, and the first tungsten plug layer sequentially stacked; and wherein the oxide transistor layer comprises a lap-joint electrode layer, a second passivation layer, an oxide active layer, a seventh insulation layer, a second gate layer, an eighth insulation layer, a second source drain layer, a third passivation layer, and a second tungsten plug sequentially stacked on the silicon substrate;

wherein the lap-joint electrode layer comprises a first lap-joint electrode and a first signal line, and the first lap-joint electrode covers the first tungsten plug; the second source drain layer comprises a source and the drain, the source is electrically connected to both an end of the oxide active layer and the first signal line, and the drain is electrically connected to both another end of the oxide active layer and the first lap- joint electrode; the second tungsten plug is disposed on the drain and passes through the third passivation layer, and the second tungsten plug is electrically connected between the drain and an anode of a light-emitting device in the display panel.

* * * * *